United States Patent [19]
Schenk

[11] Patent Number: 5,307,029
[45] Date of Patent: Apr. 26, 1994

[54] METHOD AND APPARATUS FOR GENERATING MULTIPLE FREQUENCY TONES USING A DIGITAL FREQUENCY DIVIDER

[75] Inventor: D. Stuart Schenk, Yorba Linda, Calif.

[73] Assignee: Hughes Aircraft Company, Los Angeles, Calif.

[21] Appl. No.: 911,597

[22] Filed: Jul. 10, 1992

[51] Int. Cl.$^5$ ............................................. H03B 21/01
[52] U.S. Cl. ...................................... 331/37; 328/17; 331/60; 331/76
[58] Field of Search ............... 331/37, 60, 76; 328/17, 328/18

[56] References Cited

U.S. PATENT DOCUMENTS 3,668,327  6/1972  Euchner et al. ................... 331/76 X
3,777,271 12/1973  Telewski ............................ 331/76 X Primary Examiner—Siegfried H. Grimm
Attorney, Agent, or Firm—Wanda K. Denson-Low

[57] ABSTRACT

Generation of multiple, harmonically related frequency outputs is achieved using a digital asymmetrical harmonic waveform generator, such as a high speed digital frequency divider, for example. The digital frequency divider is used with a division ratio that provides a nonsymmetrical waveform that generates a fundamental and odd and even harmonics of the fundamental derived from a reference frequency signal. The harmonically related frequency outputs from the digital frequency divider may be buffered, filtered, and mixed with the reference frequency signal to obtain a series of clean, single frequency tones suitable for use as frequency conversion local oscillator signals. The result is a small, low power, low cost multiple frequency tone generator.

6 Claims, 2 Drawing Sheets

METHOD AND APPARATUS FOR GENERATING MULTIPLE FREQUENCY TONES USING A DIGITAL FREQUENCY DIVIDER

BACKGROUND

The present invention relates generally to methods and apparatus for generating multiple frequency tones, and more particularly, to such methods and apparatus that employ high speed digital frequency dividing to generate multiple frequency tones and provide for a small, low power, low cost multiple frequency tone generator.

Typical multiple, harmonically-related tone generators, also called "comb generators," use one of two methods. One method is to generate harmonically related tones using an "impulse function" methods. This method takes a single frequency tone from a reference source and processes it through a circuit that generates an impulse signal, or very short duration pulse from the signal. This short pulse has sharp leading and trailing edges and a short pulse duration results in the generation of multiple harmonics of the reference frequency tone comprising the generating signal. The quantity and level of the harmonics can be controlled by varying the pulse duration and the rise and fall time of the impulse signal. The hardware needed to generate this short duration pulse can be complex and difficult, especially if multiple harmonics are required. The resulting signal must be divided into multiple paths, and each path individually buffered and filtered. Because the impulse method can require additional signals (such as the control signal that gates the short duration pulse), filtering of the output signal can be difficult.

The primary disadvantages of the impulse method of comb generation is the more complex nature of the hardware needed to generate the short duration pulse needed to generate multiple harmonically related signals. This method has been widely used, and will continue to be used for applications where the frequency or bandwidth of the desired signals are outside the capabilities of available digital dividers.

A second method of generating multiple frequency tones is to use multiple, separate reference signal sources. A device employing this method is very large and costly since a separate signal source is needed for each desired signal tone. A slight variation on this approach is to use other components such as mixers, frequency multipliers or dividers, or other similar hardware to generate some of the tones. The disadvantage of these variations of the basic method is that each tone generated needs separate hardware. Once again each output signal must be individually buffered and filtered to assure interference free output tones.

The primary disadvantage of the multiple source method is the quantity and cost of the hardware needed to generate the desired tones. Its reference source generator typically comprises a large physical portion of the device, and since each output signal requires a separate reference source, the net result is a very large (and quite costly) implementation. The advantage of the multiple source method is that the outputs do not have to be harmonically related.

In view of the above, and in order to provide for an improvement over the above-cited conventional techniques, it is an objective of the present invention to provide for means and methods for generating multiple frequency tones that employs high speed digital frequency divider devices to generate multiple frequency tones.

SUMMARY OF THE INVENTION

In order to provide for the above and other objectives, the present invention provides for a tone generator that generates multiple, harmonically related outputs, or tones, using an asymmetrical harmonic waveform generator, such as a high speed digital frequency divider, for example. The multiple harmonically related tones are achieved by providing a reference signal and applying it to the digital frequency divider, for example. Then the present invention makes use of naturally occurring harmonics of the output signal from the digital frequency divider to obtain a series of clean, single frequency tones suitable for use as frequency conversion local oscillator signals. Using the asymmetrical harmonic waveform generator, such as the digital frequency divider, for example, whose division ratio provides a nonsymmetrical waveform assures the ready availability of both odd and even harmonics of the reference signal. The result is a small, low power, low cost multiple frequency tone generator.

The present invention takes advantage of the naturally occurring harmonics at the output of the high speed digital divider and uses them to generate the series of tones. In a specific embodiment, the present invention uses a divide-by-six divider to generate a series of tones (comb of frequencies) from 200 MHz to 800 MHz, derived from a 1200 MHz reference signal source. The 200 MHz to 800 MHz signals are present because the divide-by-six divider frequency divides the 1200 MHz reference frequency signal down to 200 MHz, and an output waveform provided thereby is an asymmetrical signal with very fast rise and fall edges. The output waveform has a time domain representation with unequal on and off times. A Fourier series of such an asymmetrical waveform demonstrates significant even harmonic content. The output of the divider also has very sharp rise and fall times (fast turn on leading edge, and fast turn off trailing edge). The Fourier series of such a waveform with sharp rise and fall edges demonstrates significant odd harmonic content. When these two aspects are combined, the output waveform is seen to demonstrate very high levels of both odd and even harmonics.

One advantage of using a high speed digital divider is that the harmonic content is largely unaffected by frequency variations or temperature variations. As long as the divider is operated with an input frequency well within its maximum allowable range (as high as 4 GHz for some devices), and over a temperature range within its design tolerance (typically $-55°$ C. to $+125°$ C.), the harmonic content does not vary more than a few dB.

The present invention is applicable to products requiring a series of tones that are harmonically related. A product for which this invention was specifically developed is a very wide band communications transceiver. The multiple tones are used to provide coarse frequency tuning (in sub-bands) of a 2 GHz frequency band. Using the present approach, only one frequency reference source is needed to generate eight frequency tones needed to tune 2000 MHz in 200 MHz sub-bands. The present invention may be used in wide band radio receiver or transceiver applications, such as for automobiles or portable radios.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
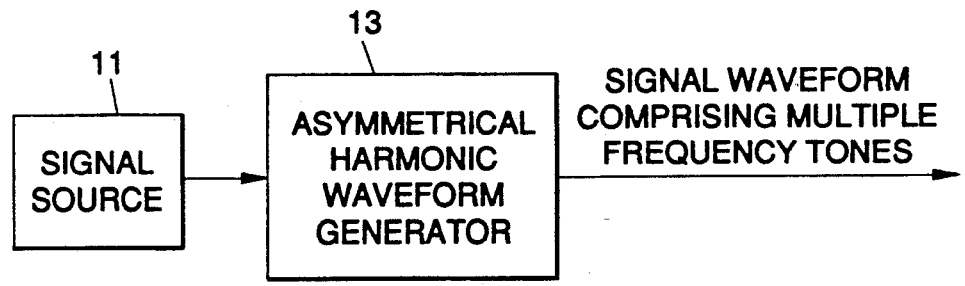
FIG. 1 is a block diagram of a most basic apparatus for generating multiple frequency tones in accordance with the principles of the present invention.

Referring to the drawing figures, FIG. 1 is a block diagram of a most basic apparatus 10 for generating multiple frequency tones in accordance with the principles of the present invention. The apparatus 10 comprises a reference signal source 11 that is adapted to provide a reference frequency output signal. The signal source 11 may comprise a phase locked oscillator or other stable frequency signal source, for example.

The output signal from the reference signal source 11 is coupled to an asymmetrical harmonic waveform generator 13. The asymmetrical harmonic waveform generator 13 may comprise a high speed digital frequency divider, for example. The characteristics of the asymmetrical harmonic waveform generator 13 are such that it has an output whose time domain representation has unequal on and off times, and also has very sharp rise and fall times (fast turn on leading edge, and fast turn off trailing edge). Any suitable digital device that produces such an output may be employed in the present invention. A Fourier series of the output waveform includes significant even harmonic content which is caused by the unequal on and off times. The Fourier series of the waveform also includes significant odd harmonic content due to the sharp rise and fall edges. When these two aspects are combined, the output waveform has both odd and even harmonics. As a result, the output of the asymmetrical harmonic waveform generator 13 is a signal waveform comprising multiple harmonically related frequency tones ($f_0$, $2f_0$, $3f_0$, $4f_0$).

Figure 2:
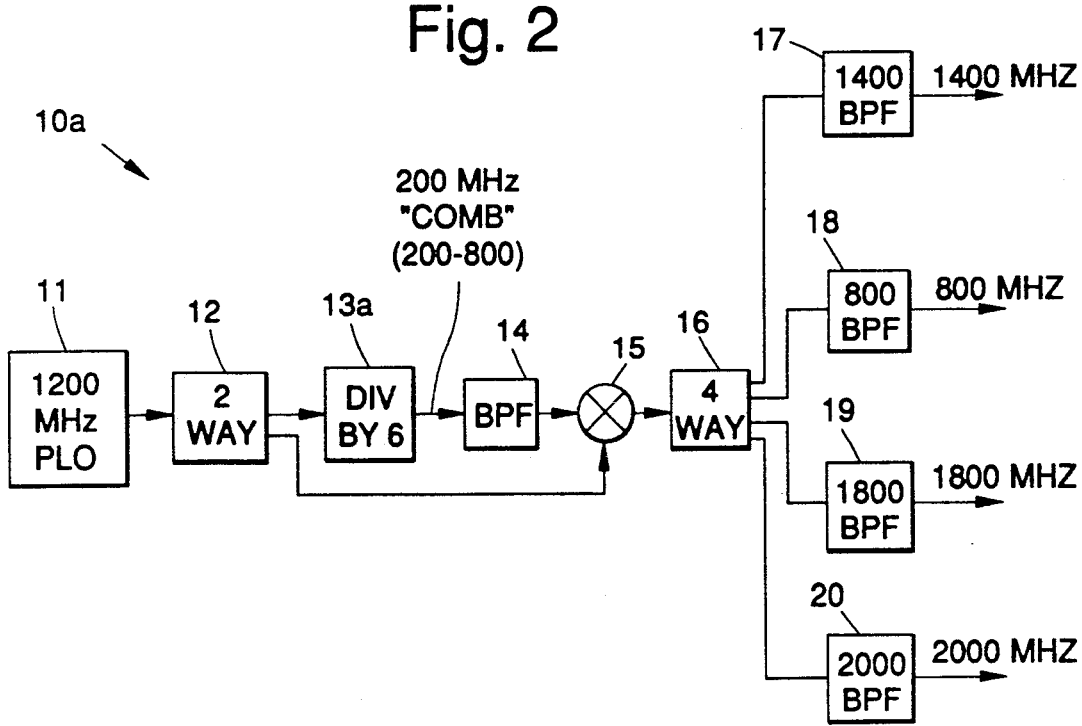
FIG. 2 is a diagram of a tone generator employing the apparatus of FIG. 1.

Referring now to FIG. 2, it is a diagram of a tone generator 10a employing the apparatus 10 for generating multiple frequency tones described with reference to FIG. 1. The tone generator 10a of the present invention uses the harmonics generated at the output of the asymmetrical harmonic waveform generator 13, and more particularly in FIG. 2, a high speed digital divider 13a and uses them to generate the series of tones. In general, the asymmetrical harmonic waveform generator 13 of the present invention provides a fundamental frequency tone and a plurality of harmonics of the fundamental frequency tone at the output of the high speed digital divider 13a.

In a specific embodiment, the present invention uses a divide-by-six divider to generate a series of tones (a comb of frequencies) from 200 MHz, 400 MHz, 600 MHz, 800 MHz ($f_0$, $2f_0$, $3f_0$, $4f_0$), derived from a 1200 MHz signal source 11 comprising a phase locked reference oscillator 11a. The divide-by-six divider 13a frequency divides the 1200 MHz reference frequency signal down to 200 MHz, and an output waveform provided thereby is an asymmetrical signal with very fast rise and fall edges. The divider 13a may be comprised of divide-by-two and divide-by-three dividers. The divide-by-three function may be achieved by providing a logic "high" for two of six clocks of the input reference frequency signal and a logic "low" for four of six clocks. A preferred embodiment of the present tone generator has the divide-by-two divider first, and therefore uses one-of-three and two-of-three input clocks to generate the asymmetrical waveform comprising the harmonically related tones.

Reference is made to a databook available from Plessey Semiconductors entitled "Frequency Dividers and Synthesizers IC Handbook", which generally describes a variety of digital dividers that may be useed in various application of the present invention. For example, the generation of asymmetric output signal is shown with reference to pages 76 and 77 of this handbook which discuss models SP8665B and SP8668B frequency dividers, for example. Proper programming of such dividers 13a is well-known in the art.

Selection of the proper "high" and "low" clock signals for the divider 13a results in an output whose time domain representation has unequal on and off times. A Fourier series of this waveform demonstrates significant even harmonic content. The output of the divider 13a also has very sharp rise and fall times (fast turn on leading edge, and fast turn off trailing edge). The Fourier series of this waveform also demonstrates significant odd harmonic content. When these two aspects are combined, the output waveform is seen to demonstrate very high levels of both odd and even harmonics. The divider 13a provides an output signal waveform having 200, 400, 600, and 800 MHz components derived from the 1200 MHz reference frequency signal.

More specifically, the apparatus 10 of the present invention comprises a phase locked reference oscillator 11a that provides a reference frequency signal that is coupled to a two way splitter 12. The reference frequency signal is applied to the frequency divider 13a, such as a model SP8741A, or similar device, available from Plessey Semiconductors, for example, to generate the "comb" of frequencies. The high speed digital divider 13a provides output signals that closely resemble square waves, with very fast rise and fall times. If the divider 13a has a divide ratio that produces an asymmetrical output (i.e., if the "on-time" of the resulting waveform is not equal to the "off-time" of the signal), the resulting output signal contains the 200 MHz fundamental tone, and also odd and even harmonics of the 200 MHz fundamental tone. The output signal from the divider 13a is filtered in a bandpass filter 14 and is mixed with the reference frequency signal in a mixer 15 to produce signals at selected other frequencies that are a function of the reference frequency signal and each of the comb frequencies. The mixer 15 combines the reference frequency signal, the fundamental and the harmonic signals ($f_0$, $2f_0$, $3f_0$, $4f_0$) in various combinations to produce an output signals comprising four different predetermined frequencies, and the four different output signals are coupled to a four way splitter 16. The four way splitter 16 applies the output signal to four separate paths, each of which is separately filtered in bandpass filters 17, 18, 19, 20, to select out a particular frequency tone for each path. Assuming that the reference frequency signal feeding the divider 13a is low-noise and free from extraneous spurious signals, the output of the divider 13a will not contain any extraneous frequency components (other than the fundamental ($f_0$) and identified harmonics ($2f_0$, $3f_0$, $4f_0$)), making the filters 17, 18, 19, 20, on each output path relatively simple.

The primary advantages of the present approach are that only a single reference frequency signal provided by a single source (phase locked oscillator 11a) is required (compared to multiple sources for the multiple, separate signal sources approach), and using a single, low-cost divider 13a (compared to the impulse approach). Thus the required signals can be obtained at lower cost and in a smaller size package using the present approach.

Another advantage of using the high speed digital divider 11 is that the harmonic content is largely unaffected by frequency variations or temperature variations. As long as the divider 11 is operated with a reference frequency signal well within its maximum allowable range (as high as 4 GHz for some devices), and over a temperature range within its design tolerance (typically $-55°$ C. to $+125°$ C.), the harmonic content does not vary more than a few dB.

Because the input to the divider is generated using a very low-noise, low-spurious generating technique (for example a surface acoustic wave based voltage controlled oscillator phase locked to the oscillator 11a), the output of the divider 13a is also low-noise and has low spurious content. The phase noise of the divider 13a is lower than the noise of the reference frequency signal, and the division ratio of the divider 13a reduces the phase noise of the reference frequency signal by a factor of 20 times the LOG of the division ratio (six in the present case). The divider 13a does not introduce any additional spurious signals (other than the mentioned harmonics), and therefore the resulting output signals provided from the bandpass filters 17, 18, 19, 20, have very low noise and low spurious content.

Figure 3:
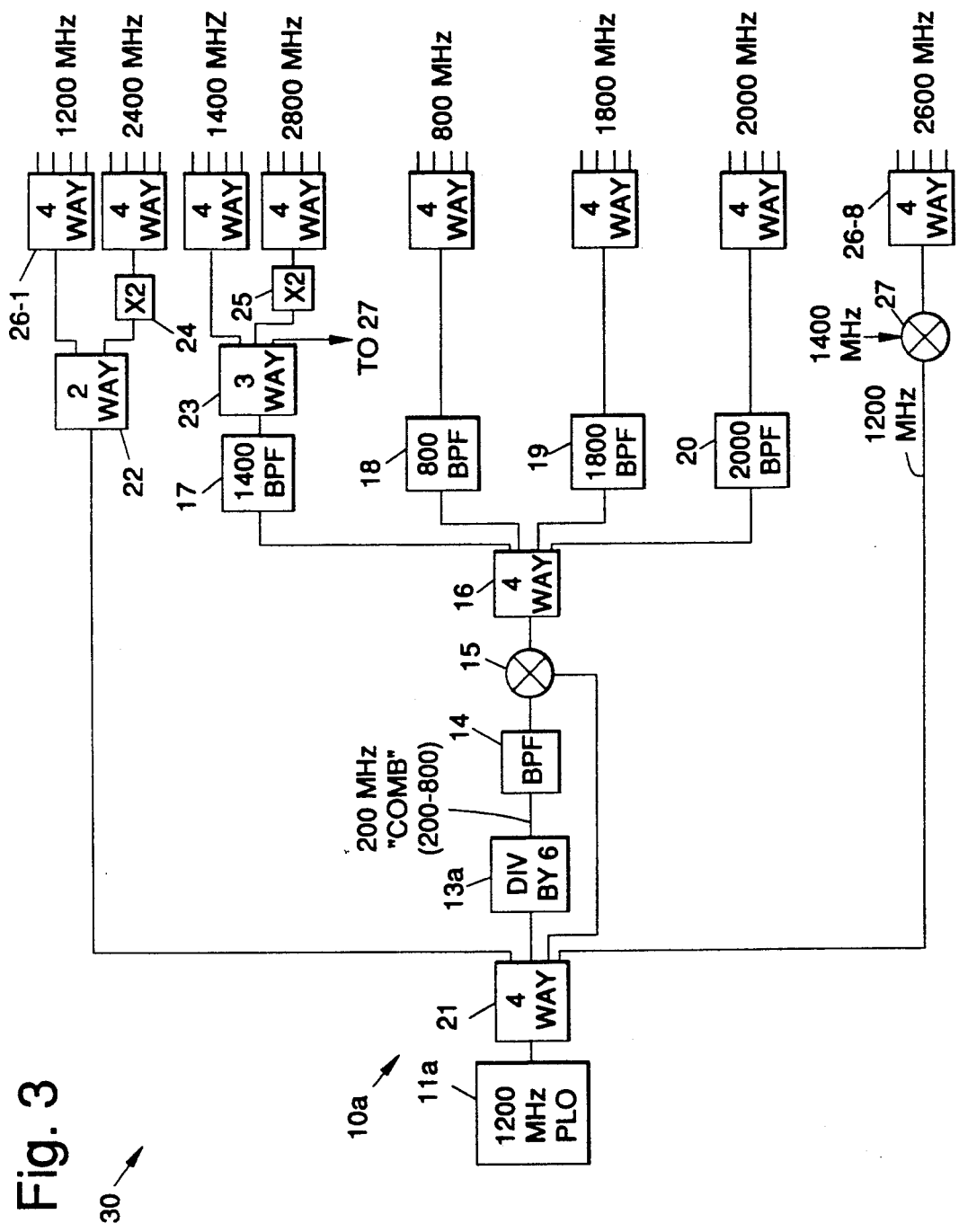
FIG. 3 is a diagram of a portion of a reference generator employing the tone generator of FIG. 2 that was built for a particular radio application.

Referring to FIG. 3, it shows a diagram of a portion of a reference generator 30 employing the tone generator 10a of FIG. 2 that was built for a particular radio application. The present invention requires a single reference source to generate eight local oscillator signals needed to tune from 2 MHz to 2 GHz in 200 MHz steps for a tone generator used in a man-portable radio currently under development by the assignee of the present invention. This allows the radio to be implemented in a very small volume (which is a requirement for the man-portable radio), and with much lower power and cost. In this particular use of the present invention, the output of the divider 13a is filtered to preclude all except the fundamental, second, third, and fourth harmonics ($f_0$, $2f_0$, $3f_0$, $4f_0$), and then mixed with reference frequency signal. This provides for the generation of signals of 800 MHz, 1400 MHz, 1800 MHz, and 2000 MHz as was described above. The 1200 MHz reference frequency signal is also used. In the implementation of the above-cited radio, the 1200 MHz and 1400 MHz signals are then frequency doubled by frequency doublers 24, 25 (identified as X2 in FIG. 3) to obtain two other signals at 2400 MHz and 2800 MHz. The final signal is obtained by mixing the 1200 MHz fundamental frequency signals and the 1400 MHz signal, resulting in an eighth local oscillator tone at 2600 MHz.

The present invention is applicable to products requiring a series of tones that are harmonically related. The above-cited radio for which this invention was specifically developed is a very wide band communications transceiver. The multiple tones are used to provide coarse frequency tuning (in sub-bands) of a 2 GHz frequency band. Using the present approach, only one frequency reference source is needed to generate the eight frequency tones needed to tune 2000 MHz in 200 MHz sub-bands. The present invention may be also applied to communications needs of automobiles, such as wide band radio receivers, or other wide band commercial applications.

Thus there have been described new and improved methods and apparatus for generating multiple frequency tones that employ high speed digital frequency divider devices. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. An apparatus for generating multiple frequency tones comprising:

a signal source for providing a reference frequency signal; and an asymmetrical harmonic waveform generator coupled to the signal source that is adapted to provide an output signal whose time domain representation has unequal on and off times and sharp rise and fall times, which output waveform comprises multiple, harmonically related tones, said asymmetrical harmonic waveform generator comprising a digital frequency divider comprising a division ratio that is adapted to provide a nonsymmetrical waveform that produces odd and even harmonics of a fundamental tone derived from the reference frequency signal and wherein the digital frequency divider is adapted to divide the reference frequency signal by a predetermined number to provide a fundamental tone and a plurality of harmonics of the fundamental tone;

a first splitter disposed between the signal source and the digital frequency divider for coupling the reference frequency signal to the digital frequency divider and along a second path;

a first bandpass filter coupled to the digital frequency divider for filtering the reference frequency signal, the fundamental tone and the plurality of harmonics of the fundamental tone provided by the digital frequency divider;

a mixer coupled to the first bandpass filter for selectively combining the reference frequency signal with the fundamental tone and the plurality of harmonics of the fundamental tone to provide a signal comprising a plurality of predetermined frequency components;

a second splitter coupled to the mixer for coupling the signal comprising a plurality of predetermined frequency components along a selected plurality of output paths; and a plurality of bandpass filters individually disposed along a respectively one of the plurality of output paths, each bandpass filter providing a tone at a selected one of a plurality of predetermined frequencies.

2. The apparatus for generating multiple frequency tones of claim 1 that is adapted to provide eight predetermined tones and which further comprises:

a third splitter coupled to the first splitter and wherein the reference frequency signal is coupled to the third splitter, and wherein the third splitter provides a first tone at a first predetermined frequency, and couples the reference frequency signal through a first frequency doubler to provide a second tone at a second predetermined frequency; and a fourth splitter coupled to a selected one of the plurality of bandpass filters that provides a third tone at a third predetermined frequency and couples the third tone through a second frequency doubler to provide a fourth tone at a fourth predetermined frequency, and that couples the third tone to a second mixer that combines the reference frequency signal and the third tone to produce a fifth tone at a fifth predetermined frequency;

and wherein the remaining filters of the plurality of bandpass filters provide sixth, seventh and eighth tones at sixth, seventh and eighth predetermined frequencies.

3. Apparatus for generating multiple frequency tones comprising:

an oscillator for providing a reference frequency signal;

a first splitter for coupling the reference frequency signal along first and second paths;

a digital frequency divider coupled to the first splitter for dividing the reference frequency signal by a predetermined number to provide a fundamental tone and a plurality of harmonics of the fundamental tone;

a first bandpass filter coupled to the digital frequency divider for filtering the reference frequency signal, the fundamental tone and the plurality of harmonics of the fundamental tone provided by the digital frequency divider;

a mixer coupled to the first bandpass filter for selectively combining the reference frequency signal with the fundamental tone and the plurality of harmonics of the fundamental tone to provide a signal comprising a plurality of predetermined frequency components;

a second splitter coupled to the mixer for coupling the signal comprising the plurality of predetermined frequency components along a selected plurality of output paths; and a plurality of bandpass filters individually disposed along a respectively one of the plurality of output paths, each bandpass filter providing a tone at a selected one of a plurality of predetermined frequencies.

4. The apparatus for generating multiple frequency tones of claim 3 further comprising:

a third splitter coupled to the first splitter and wherein the reference frequency signal is coupled to the third splitter, and wherein the third splitter provides a first tone at a first predetermined frequency, and couples the reference frequency signal through a first frequency doubler to provide a second tone at a second predetermined frequency; and a fourth splitter coupled to a selected one of the plurality of bandpass filters that provides a third tone at a third predetermined frequency and couples the third tone through a second frequency doubler to provide a fourth tone at a fourth predetermined frequency, and that couples the third tone to a second mixer that combines the reference frequency signal and the third tone to produce a fifth tone at a fifth predetermined frequency;

and wherein the remaining filters of the plurality of bandpass filters provide sixth, seventh and eighth tones at sixth, seventh and eighth predetermined frequencies.

5. Apparatus for generating multiple frequency tones comprising:

an oscillator for providing a reference frequency signal;

a first splitter for coupling the reference frequency signal along first and second paths;

a digital frequency divider coupled to the first splitter for dividing the reference frequency signal by a predetermined number to provide a fundamental tone and a plurality of harmonics of the fundamental tone;

a first bandpass filter coupled to the digital frequency divider for filtering the reference frequency signal, the fundamental tone and the plurality of harmonics of the fundamental tone provided by the digital frequency divider;

a mixer coupled to the first bandpass filter for selectively combining the reference frequency signal with the fundamental tone and the plurality of harmonics of the fundamental tone to provide a signal comprising a plurality of predetermined frequency components;

a second splitter coupled to the mixer for coupling the signal comprising the plurality of predetermined frequency components along a selected plurality of output paths;

a plurality of bandpass filters individually disposed along a respectively one of the plurality of output paths, each bandpass filter providing a tone at a selected one of a plurality of predetermined frequencies a third splitter coupled to the first splitter and wherein the reference frequency signal is coupled to the third splitter, and wherein the third splitter provides a first tone at a first predetermined frequency, and couples the reference frequency signal through a first frequency doubler to provide a second tone at a second predetermined frequency; and a fourth splitter coupled to a selected one of the plurality of bandpass filters that provides a third tone at a third predetermined frequency and couples the third tone through a second frequency doubler to provide a fourth tone at a fourth predetermined frequency, and that couples the third tone to a second mixer that combines the reference frequency signal and the third tone to produce a fifth tone at a fifth predetermined frequency;

and wherein the remaining filters of the plurality of bandpass filters provide sixth, seventh and eighth tones at sixth, seventh and eighth predetermined frequencies.

6. A method for generating multiple frequency tones comprising the steps of:

providing a reference frequency signal:

digitally frequency dividing the reference frequency signal by a predetermined number to provide a plurality of harmonically related frequency outputs comprising a fundamental tone and a plurality of harmonics of the fundamental tone; and mixing the harmonically related frequency outputs with the reference frequency signal to obtain a series of single frequency tones.

* * * * *